US010893324B2

(12) United States Patent
Soulier (10) Patent No.: US 10,893,324 B2
(45) Date of Patent: Jan. 12, 2021

(54) VIEWING DATA TRANSFER USING BARCODE OR QR CODE AND SIGNAL CAPTURE DEVICE

(71) Applicant: SmarDTV SA, Cheseaux-sur-Lausanne (CH)

(72) Inventor: Julien Soulier, Auriol (FR)

(73) Assignee: SmarDTV SA, Cheseaux-sur-Lausanne (CH)

( * ) Notice: Subject to any disclaimer, the term of this patent is extended or adjusted under 35 U.S.C. 154(b) by 0 days.

(21) Appl. No.: 16/473,937

(22) PCT Filed: Jul. 31, 2017

(86) PCT No.: PCT/EP2017/069332
§ 371 (c)(1),
(2) Date: Jun. 26, 2019

(87) PCT Pub. No.: WO2018/024679
PCT Pub. Date: Feb. 8, 2018

(65) Prior Publication Data
US 2020/0014975 A1   Jan. 9, 2020

(30) Foreign Application Priority Data
Aug. 4, 2016 (EP) .................................... 16306015

(51) Int. Cl.
*H04N 21/442* (2011.01)
*H04N 21/41* (2011.01)
(Continued)

(52) U.S. Cl.
CPC ... *H04N 21/44204* (2013.01); *H04N 21/4126* (2013.01); *H04N 21/434* (2013.01); *H04N 21/6582* (2013.01); *H04N 21/8146* (2013.01)

(58) Field of Classification Search
CPC ......... H04N 21/44204; H04N 21/4126; H04N 21/434; H04N 21/6582; H04N 21/8146
(Continued)

(56) References Cited

U.S. PATENT DOCUMENTS

| 5,548,338 A | 8/1996 | Ellis et al. |
| 2003/0077065 A1* | 4/2003 | Scholten ............ H04N 21/4532 386/212 |

(Continued)

OTHER PUBLICATIONS

International Search Report dated Oct. 19, 2017 in PCT/EP2017/069332 filed Jul. 31, 2017.

*Primary Examiner* — Dominic D Saltarelli
(74) *Attorney, Agent, or Firm* — Oblon, McClelland, Maier & Neustadt, L.L.P.

(57) ABSTRACT

A television broadcast receiver is provided, for example a set-top box or television set for terrestrial, cable and/or satellite broadcasts, comprising a memory for storing channel view data encoding channel view events and a processor. The processor stores channel view data in the memory and generates a signal encoding the channel view data. The signal is an audio and/or video signal. The processor then causes the signal to be presented to a viewer. Further provided is a method of receiving information about channel view events from a broadcast receiver. A signal encoding channel view data is received. The signal is a still image or video signal and/or an audio signal and the channel view data encodes channel view events. The signal is decoded to obtain the channel view data and the channel view data is decoded to obtain information about channel view events.

15 Claims, 8 Drawing Sheets

(51) Int. Cl.
*H04N 21/434* (2011.01)
*H04N 21/658* (2011.01)
*H04N 21/81* (2011.01)

(58) Field of Classification Search
USPC .......................................................... 725/20
See application file for complete search history.

(56) References Cited

U.S. PATENT DOCUMENTS

| | | |
|---|---|---|
| 2012/0222081 A1 | 8/2012 | Schaefer et al. |
| 2013/0032634 A1 | 2/2013 | McKirdy |
| 2016/0361599 A1 | 12/2016 | McKirdy |

* cited by examiner

Fig. 5

VIEWING DATA TRANSFER USING BARCODE OR QR CODE AND SIGNAL CAPTURE DEVICE

The present invention relates to transferring data relating to zapping information, in particular information about channel view events, from a broadcast receiver, in particular although not exclusively a receiver such as an entry-level set-top box having no bi-directional data connection, referred to herein as a non-connected STB.

BACKGROUND

Collecting data about an audience's viewing habits, which channels are watched and when (i.e. which programs are watched) is useful to broadcasters to judge the popularity of programming. Connected receivers that have a return path to the broadcaster or other service providers, either via the Internet or over a dial-up line, facilitate the collection of this data. However, large segments of the market, in particular in developing countries, do not have such a return path, for example where non-connected STBs are prevalent.

BRIEF DESCRIPTION OF THE DRAWINGS

The accompanying drawings illustrate some specific embodiments by way of example to further the understanding of the disclosure. Specifically.

DETAILED DESCRIPTION OF THE DRAWINGS

In overview, aspects of the disclosure provide a television broadcast receiver, for example a set-top box or television set for terrestrial, cable and/or satellite broadcasts, comprising a memory for storing channel view data encoding channel view events and a processor. The processor stores channel view data in the memory and generates a signal encoding the channel view data. The signal is an audio and/or video signal. The processor then renders the signal and causes the signal to be presented to a viewer for capture using a capture device. Optionally, a prompt prompting the user to capture the signal may be caused to be presented.

A channel view event may be one or more of the following events: display of a channel defined by start time and duration; display of a channel started; display of a channel ended;

switch from one channel to another; scheduling a recording on a channel; recording a program on a channel; display of a particular program or series; scheduling a recording for a particular program or series; recording a particular program or series; displaying or skipping of an advertisement; etc.

Advantageously, by presenting a signal that can be captured by the viewer with a signal capture device, such as a mobile phone, viewing data can be transferred via the signal capture device as described below without the need for a back channel connection at the receiver, enabling, for example, viewing data to be collected from non-connected STBs.

The signal may be a 2-dimensional pattern, such as a QR code, a HCCB code (Microsoft Research, "High Capacity Color Barcode Technology", incorporated herein by reference) or HCC2D code ("High Capacity Colored Two Dimensional code", IMCSIT, 2010, incorporated herein by reference) encoding the channel view data and displayed on a display device such as a television screen. Alternatively or additionally, the signal may comprise an audio signal, for example encoding the data using frequency modulation, as is well known in the field of computer modems. The signal may be generated periodically.

The receiver may, in some embodiments, receive information indicative of the frequency with which channels are viewed and use the information to encode channel view events. In this way, smaller (in terms of bits) symbols can be chosen for more frequent channels, reducing the number of bits required to encode the channel view data. The information may be received in a broadcast, for example as part of conditional access system (CAS) data such as in an entitlement management message (EMM) or as an over the air (OTA) software update. The information may indicate viewing frequency by the order of channels in an ordered list of channels. The symbols used for designating channels on the receiver may be logical channel numbers (LCN) such as numbers or alphanumeric symbols or may be any other set of symbols capable of identifying the broadcast channels. Alternatively, the receiver may receive information assigning symbols for designating channels to respective channels, wherein the assignment has been made based on viewing frequency, for example using entropy encoding. In either case, the symbols may be used for more efficient encoding of channel view events, in particular if the viewing frequency information or the assignment of symbols to channels is based on viewing frequencies measured at the receiver (as opposed to viewing frequencies accumulated from multiple receivers or globally).

In some embodiments, encoding channel view events comprises encoding channel view events using a duration indication and a start time indication for each channel view event and the respective representations of the duration and/or start time indications are selected dynamically. For example, the time units of duration and/or the reference point for the start time may be selected dynamically.

Further aspects of the disclosure provide a method of receiving information about channel view events from a broadcast receiver. A signal encoding channel view data is received. The signal is a still image or video signal and/or an audio signal and the channel view data encodes channel view events. The signal is decoded to obtain information about channel view events. Obtaining information about channel view events may comprise decoding the signal to obtain the channel view data and decoding the channel view data to obtain information about channel view events. In some embodiments, prior to receiving the signal, the signal has been captured from the receiver by a viewer using a signal capture device, for example a mobile phone, a digital still or video camera, a portable computer with image and/or sound recording capabilities, etc. The viewer may be a subscriber of broadcast services provided by a broadcast provider, in which case the signal may be received by the broadcast provider and transmitted to a data collection service provider (which may be identical to the broadcast provider).

The broadcast provider typically broadcasts the channels, for example from a head end. The data collection service provider typically provides the data collection services. It may be the same entity as the manufacturer or distributor of the receiver. The broadcast and data collection service provider may be the same or different entities. The data collection service provider, in some embodiments, decodes the signal and channel view data and provides the information to the broadcast provider. For example, the signal may be received by the broadcast provider when the subscriber renews his or her subscription. In some embodiments, the decoding happens on the signal capture device and viewing data is transmitted from signal capture device, for example directly to the broadcast provider. In some embodiments, the broadcast provider receives the signal and decoding happens at the broadcast provider.

In some embodiments, the viewing information is used, for example by the broadcast or data collection service provider, to compute a viewing frequency for a set of channels broadcast to the receiver for use in associating LCNs or channel symbols with broadcast channels at the receiver. Alternatively, the assignment may be made at the broadcast or data collection service provider (or elsewhere) and information associating symbols and channels based on the viewing frequency may be transmitted to the receiver. In some embodiments, the LCNs or symbols may be local to the receiver, for example derived at or for the receiver or selected by the receiver from a number of sets of assigned symbols. The LCNs or symbols may be used to generate the signal. For example, viewing events may be stored using the LCNs or symbols. In some embodiments, information indicative of the viewing frequency for the set of channels (or information associating symbols and channels, as the case may be) is broadcast to the receiver, for example as part of management information in a conditional access system, or as an OTA software update and may be specific to an individual receiver, comprise different sets of symbol/channel associations for the receiver to pick from or may apply globally to a set of receivers.

Some aspects relate to a method of assigning symbols to channels, for use by receivers in encoding channel view data. The symbols are assigned to respective channels based on viewing frequency of the channels to generate a channel map, that is information associating the symbols to respective channels. The assignment is made such that smaller symbols (in terms of the bits required to represent the symbol) are assigned to more frequently viewed channels, so that data compression can be improved by using the symbols to represent channel view events. Viewing frequency may be determined from data from a single receiver, a group of receivers or globally. The channel map may be transmitted to one or more receivers from which viewing frequency data was obtained, for example by receiving channel view data from the one or more receivers. The channel map may be specific to viewing frequencies at a particular receiver and may be transmitted to that receiver by broadcasting as part of an EMM message. Alternatively, a number of channel maps may be defined using respective sets of viewing frequencies and transmitted to the one or more receivers, with each receiver also receiving an identifier identifying the channel map to use, for example in an EMM message. The identified channel map may have been determined for the receiver in question, or for a group of related receivers, for example related by demographics or user profiles. In yet other embodiments, viewing frequency is collected globally and a single channel map is transmitted to a set of receivers, for example all receivers receiving a particular broadcast service.

While some aspects of the disclosure are described in terms of storing channel view data and generating a signal encoding the channel view data, the disclosure is not so limited. Aspects of the disclosure extend to embodiments in which the broadcast television receiver stores any kind of data and generates and causes presentation of an audio or video signal encoding the data for capture by the viewer with a signal capture device. In particular, the data may be dynamic data, that is data that may change over time and is collected (and stored) by the television broadcast receiver over time. Examples of such dynamic data, other than channel view data, are settings such as language settings, favourite channels, etc; selected language if programs are available in multiple languages; data relating to teletext usage or other interactive services; stand-by times; etc. The encoding and/or compression algorithm used, if any, may depend on the specific type of data, while the transformation of the bits of the resulting code into a signal to be presented may be the same for the different types of data (or may be adapted to take account of different data capacity requirements).

Aspects of the disclosure further extend to one or more computer readable non-transitory media or a computer program product for capturing a signal, for example as described above, indicative of viewing data, and for providing the signal or data encoded in the signal to a third party, for example a broadcast provider. Aspect further extend to a mobile device, such as a mobile phone comprising such non-transitory media or computer program product. Yet further aspects extend to a method of presenting viewing data as implemented by a receiver as described above and to a system having means for implementing such a method and/or methods as described above. Some specific embodiments will now be described with reference to the accompanying drawings.

Figure 1:
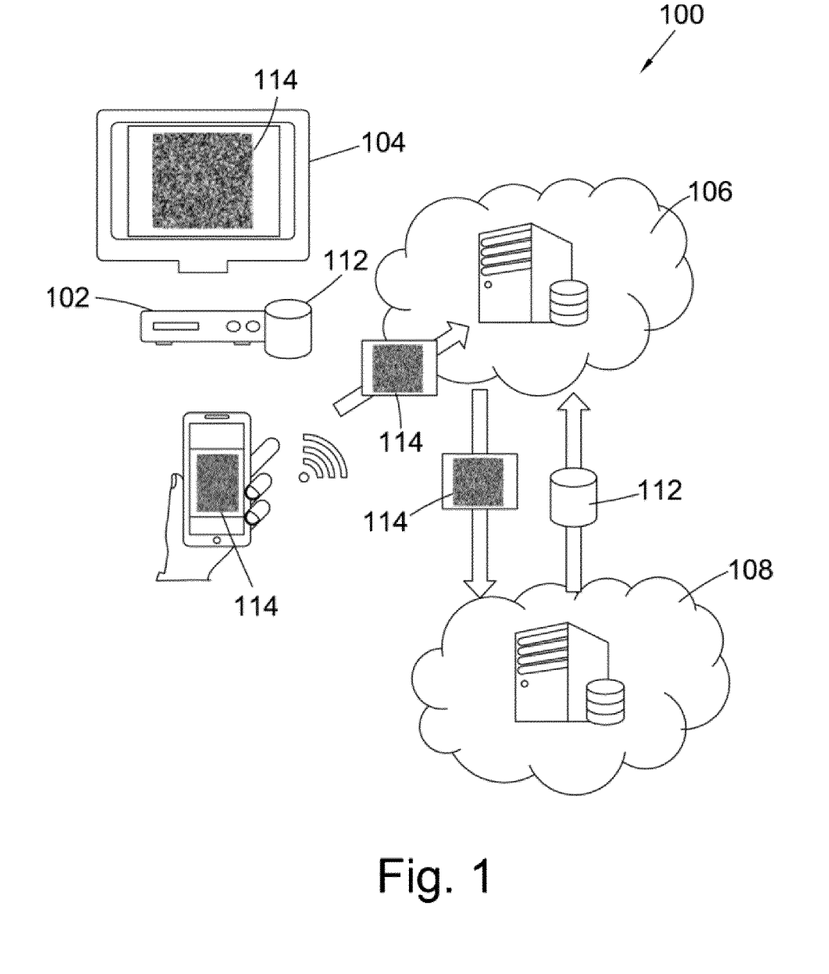
FIG. 1 illustrates a broadcast system.

With reference to FIG. 1, a broadcast system 100 comprises a receiver 102, for example a non-connected set-top box or other non-connected receiver, a display device 104, for example a television set, a broadcast provider 106, for example comprising an arrangement of one or more servers and/or data centres, a data collection service provider 108, for example comprising an arrangement of one or more servers and/or data centres, and a capture device 110, for example a mobile phone equipped with a camera and/or a sound capture device, such as a smart phone. The broadcast provider 106 and data collection service provider 108 are in communication over a communications network, for example the Internet. The capture device 110 may also be in communication with the broadcast provider 106 and/or the data collection service provider 108 over the same or a different communications network.

Channel view data 112 is captured and stored by the receiver 102 and a code 114 (also referred to as a signal) is created and presented on the display device 104, for example on a display screen in case of an image or video signal or using loudspeakers of the display device in case of an audio signal. The code is captured by the capture device 110 and is transmitted to the data collection service provider 108, for example via the broadcast provider 106. The data collection service provider 108 extracts the channel view data and makes it available to the broadcast provider 106, either enabling access to the data or sending it to the broadcast provider 106. The code 114 may be transmitted from the capture device 110 to the broadcast provider 106 and/or data collection service provider 108 over a communications network (for example the Internet). Alternatively, the code 114 can be transmitted to the broadcast provider 106 (or data collection service provider 108) by physically taking the capture device 110 to an outlet or representative of the relevant provider, where the code is captured either optically (or acoustically, as the case may be) or over a wired or short-range wireless data connection and transmitted onward to the relevant provider, for example over the same or a different communications network.

Processes involved in the transmission of channel view data in the system described with reference to FIG. 1 are now described with reference to FIGS. 2A-2D. At step 202, the receiver 102 captures and stores channel view data, that is data about channel view events, for example as defined above. Then, for example in response to storing a new channel view event or periodically, the receiver 102 compresses the channel view data, for example as described in detail below, at step 204. This may, for example, occur monthly when smart card rights of a smart card of a CAS system implemented on the receiver 102 expire or are about to expire. At step 206, a code, for example a HCC2D code (or a different visual or audio code) is generated by the receiver 102 and at step 208 the receiver causes presentation/display of the code on the display device 104, for example by sending an appropriate signal to the display device 104 if the display device 104 is separate from the receiver. When presenting the code, the receiver 102 may also cause presentation/display of a prompt to the user on the display device 104 in the same way.

Figure 2A:
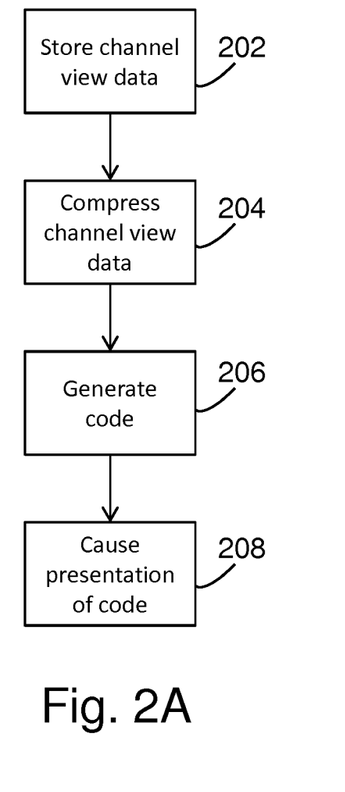
FIGS. 2A-2D illustrate data transmission processes in the system of FIG. 1.

Examples of suitable codes suitable for analogue SD television screens are 80×80 dots or squares arrayed in a column and row layout and comprising 8 colour values, which in some embodiments can encode up to 2 KB of data (ignoring error correction codes). For a HD television screen the number of dots/squares can be increased to 120×120 dots with 8 colours, enabling encoding of more than 5 KB. Some embodiments use 6 instead of 8 colours and may use other element shapes, for example triangles. To better exploit wide-screen displays, such as 16:9 aspect ratio displays, generally rectangular (rather than square) arrangements and/or elements may be used. In practice it has been found that 1.5 KB is sufficient to encode channel view data for a 30 day period, for example.

Figure 2B:
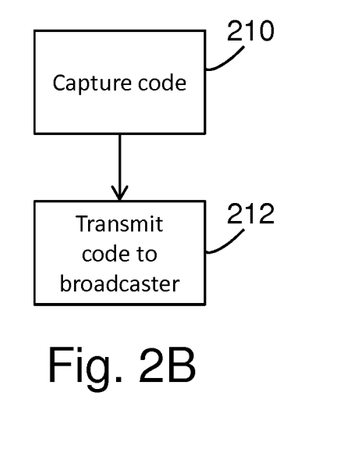

A viewer, when prompted by the receiver 102, captures the code 114 at step 210 with the capture device 110, for example taking a picture of the display on the display device 104 with an internal camera of a smart phone. In some embodiments, a dedicated application is run to that end on the capture device 110 to increase robustness of the capture and allow higher resolution, for example in the same way as panoramic picture capture on smart phones. The dedicated application may also handle other aspects, such as payment for renewing a subscription to one or more services provided by the broadcast provider 106. In other embodiments, the code 114 is captured as a digital image using a camera application running on the capture device 110.

At step 212 the viewer transmits the code 114 to the broadcast provider 106 (or data collection service provider 108 or other entity). In embodiments in which the capture device 110 has an internet connection, the code 114 may be transmitted over the internet or other network connection, for example using the same portal used to renew the user's smart card. Where an internet connection is not available, the code 114 may be transmitted, for example, by multimedia message (MMS). Where this is also not possible or not desirable, the code may be transmitted to the broadcast provider 106 by taking the capture device to an outlet or shop associated with the broadcast provider 106, for example at the same time as renewing the smart card. The code can be captured at the shop by taking a picture of a screen of the capture device, by short-range wireless connection, wired connection, etc., followed by transmission of the code to the broadcast provider 106, for example, over a communications network.

Figure 2C:
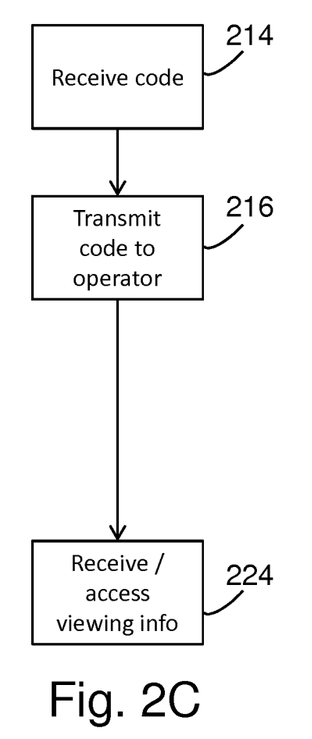
Figure 2D:
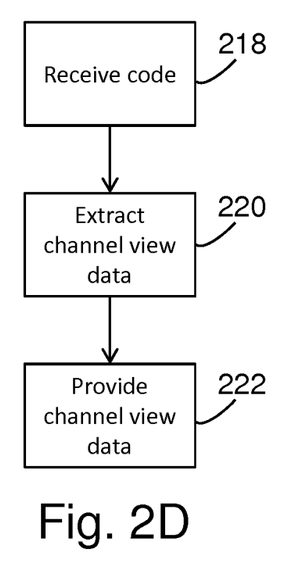

At step 214, in case of transmission to the broadcast provider 106, the broadcast provider 106 receives the code and transmits it to the data collection service provider 108 at step 216. The data collection service provider 108 receives the code at step 218, extracts the channel view data at step 220 and provides the channel view data to the broadcast provider 106 at step 222. The broadcast provider 106 receives or accesses the channel view data at step 224 and uses the data, for example for audience measurements or as described further below. The data may be provided to the broadcast provider 106 as extracted, i.e. in compressed form or may be processed to extract information about viewing events to provide to the broadcast provider 106 in a format that is readily useable by the broadcast provider 106. It will be appreciated that, while a certain division of the above steps has been described, the assignment and order of steps can vary from embodiment to embodiment. For example, some or all of the described processing can be carried out by the capture device 110, and some or all of the processing done by the data collection service provider 108 may be done by the broadcast provider 106 and vice versa, with corresponding changes in the described data flow.

Figure 3A:
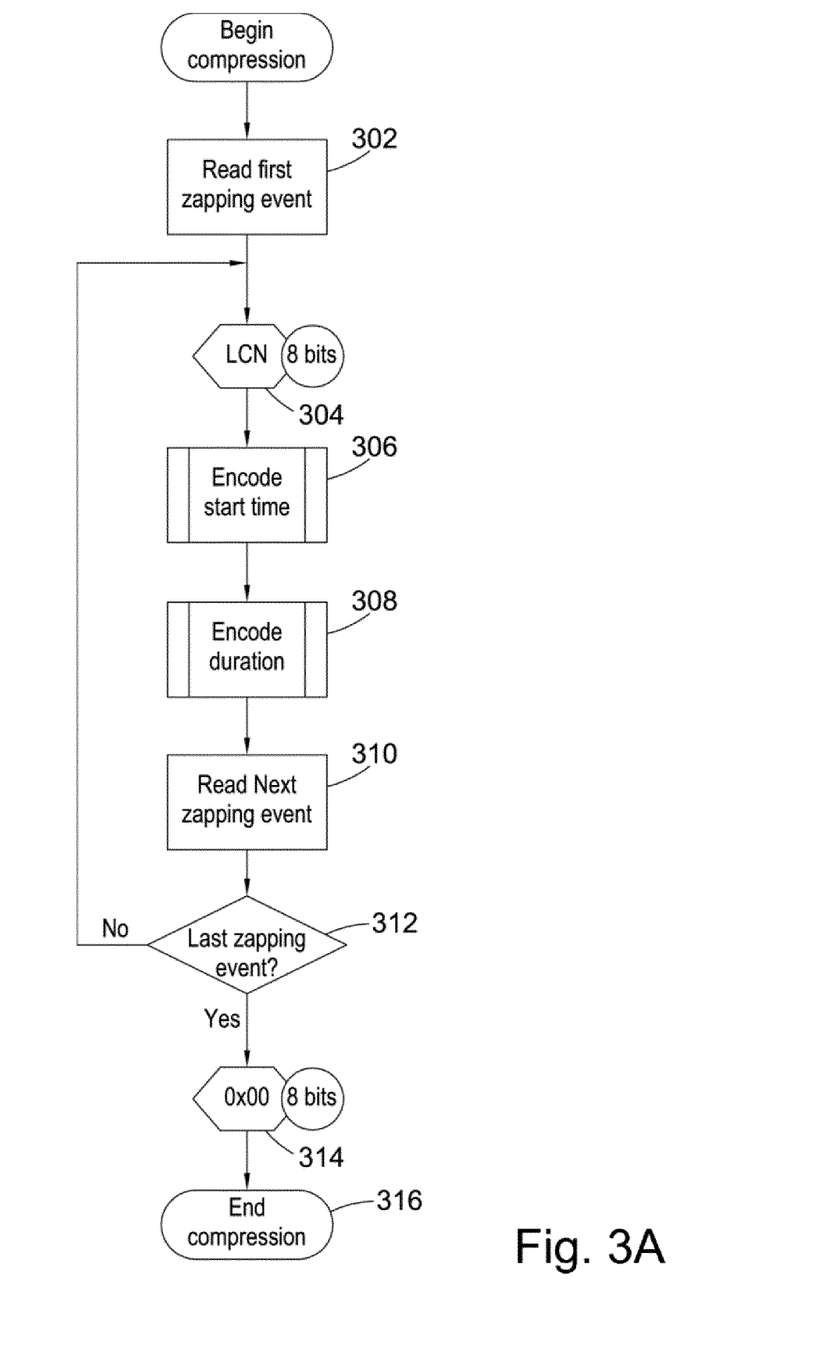
FIGS. 3A-3C illustrate a process for data compression used in the process of FIG. 2A.

With reference to FIG. 3A, a process for data compression at step 204 is now described with numerals in brackets referring to steps in the flow diagram illustrated in FIG. 3A. A channel view (or zapping) event is read (302) and a local channel number (LCN) is written to a data string to form the channel view data (304), followed by encoding and writing of the start time of the event (306) and the duration (308), for example as described below with reference to FIGS. 3B and 3C, respectively. Then, the process attempts to read a next channel view event (310) and determines if a further event was found (312). If a further event is found the process loops back to step 304 to write the LCN for the next event to the data string. Otherwise (the event just written was the last event), the process writes an end code (314), for example eight zero bits, and the process ends (316). Thus, the data is written as a data string representing a set of records, each record comprising a LCN, the corresponding start time (for example relative to the start of the current year) and the duration (for example in minutes).

Figure 3B:
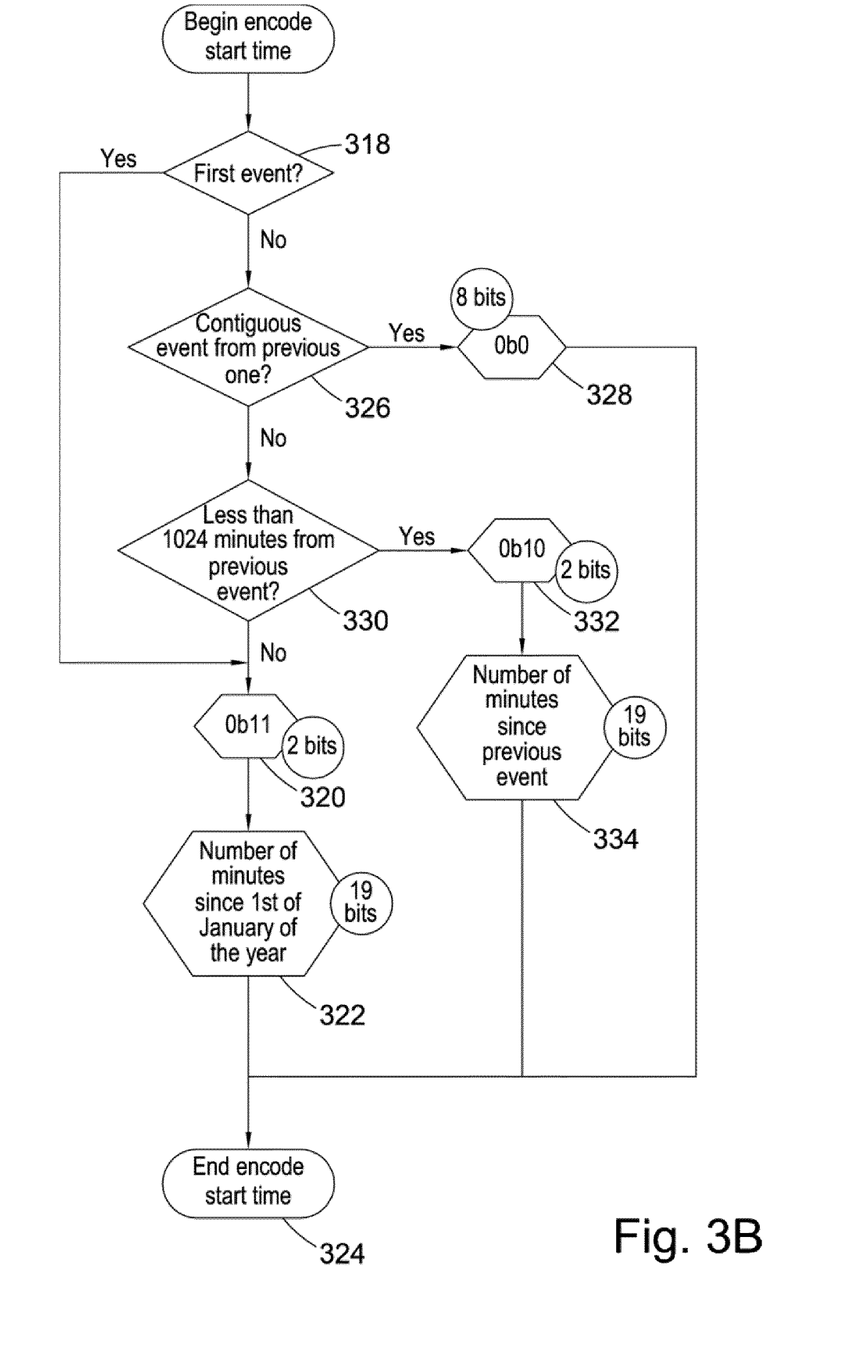

With reference to FIG. 3B, a process for encoding a start time at step 306 is now described with numerals in brackets referring to steps in the flow diagram illustrated in FIG. 3B. A determination is made (318) if the read event is the first event written to the data string and, if so, a two bit identifier indicating this is written to the data string (320), followed by number of minutes from the beginning of the current year to the start of the event (322) and the process ends (324). If the determination at step 318 is negative, a determination is made (326) if the event is contiguous from the previous event, i.e. a direct channel switch occurred, for example to the nearest minute. If the determination Is positive a different identifier, for example a single zero bit, is written to the data string (328) and the process ends (324). If the determination is negative, a determination is made (330) if the current event is less than 1024 minutes from the end of the previous event and if so a further identifier indicating this, for example a different two bit identifier, is written to the data stream (332) as well as the number of minutes that have elapsed since the end of the last event (334) and the process ends (324). If the determination at step 330 is negative, the process continues with steps 320 and 322 described above and ends at step 324.

Figure 3C:
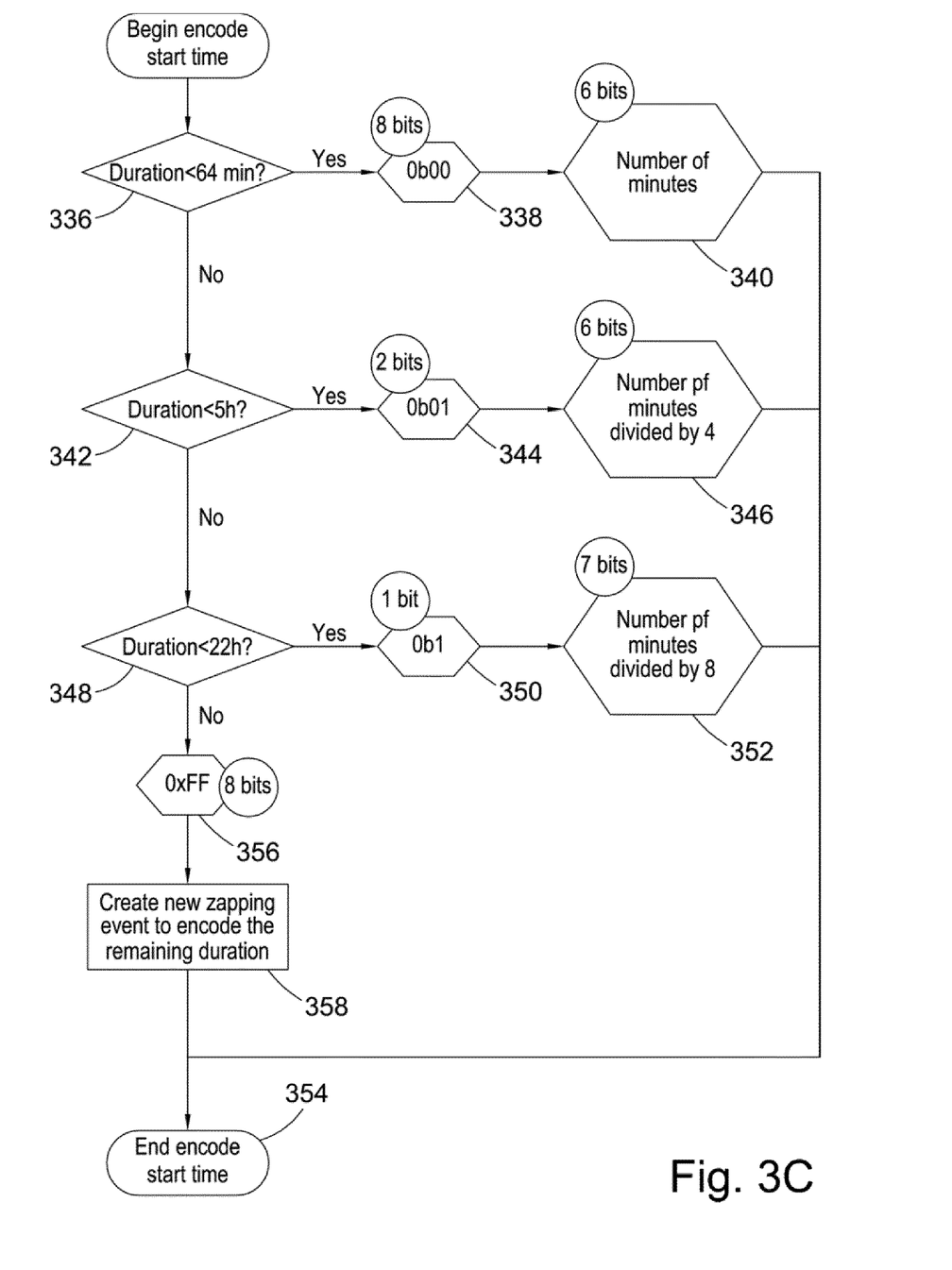

With reference to FIG. 3C, a process for encoding a duration at step 208 is now described with numerals in brackets referring to steps in the flow diagram illustrated in FIG. 3C. A determination is made (336) if the duration is less than 64 minutes and if so a two bit identifier is written to the data string (338), as well as the number of minutes (340).

Otherwise, a determination is made (342) if the duration is less than five hours and if so a different two bit identifier is written to the data string (344) followed by the number of minutes divided by four, modulus one (346). If the determination at step 342 is also negative, a determination is made (348) if the duration is less than 22 hours and if so a different one bit identifier is written to the data string (350) followed by the number of minutes divided by eight, modulus one or rounded to the nearest minute (352). In any of these three cases the process ends a step 354 subsequent to writing the indication of the duration. If the determination at step 348 is negative (the duration is 22 hours or more), an eight bit identifier is written, for example eight one bits, and a new channel view event is created (358) to encode the remaining duration and the process ends at step 354.

One possible use of the viewing data is to assign LCNs or symbols representing LCNs to channels such that LCNs or symbols that can be encoded with relatively less bits are assigned to channels that are watched frequently and LCNs or symbols that require relatively more bits to encode are assigned to less frequent channels. In this way, the LCNs or symbols can be used in an adapted compression algorithm in which the LCN field is not of fixed size but can vary so that overall less space is taken up by the LCN field due to less bits being required to write high-frequency LCNs. The LCNs or symbols may be assigned to channels using entropy encoding. It will be appreciated that existing LCNs may in fact be fixed for a given network, region, country or other administrative grouping. In this case, LCNs can not be changed but the symbols representing the LCNs may be adapted as described herein.

Figure 4A:
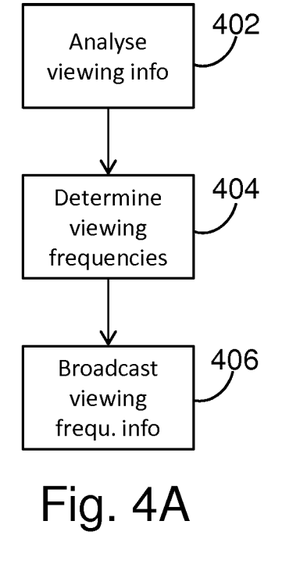
FIGS. 4A and 4B illustrate a process for generating and using channel viewing frequencies for data compression.
Figure 4B:
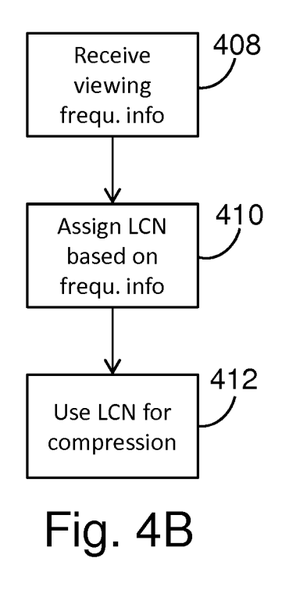

A process for deriving and using such LCN (symbol) assignments is now described with reference to FIGS. 4A and 4B. At step 402, information on viewing events collected from all or a sub-set of subscribers is analysed and viewing frequencies for the available broadcast channels are determined at step 404. In some embodiments, viewing frequencies from a single subscriber are analysed, so that the resulting representation is specific to the single subscriber in question, enabling yet further gains in compression. Information encoding the viewing frequencies may be provided in various ways, for example in the form of an ordered list of channels in order of frequency, or by explicit assignment of a mapping between physical channels and LCNs or symbols, a mapping between existing LCNs and symbols, or between physical channels and viewing frequencies. At step 406, the viewing frequency information or LCN or symbol mapping information is broadcast to all subscribers, the subset, or to the single subscriber, as the case may be. The information, in particular in the latter case, can be broadcast using the infrastructure of a CAS, for example transmitting the information to the single subscriber as part of an EMM, thus enabling the set-top box of the single subscriber to adapt its channel encoding in a way specific to the viewing habits of the single subscriber.

The receiver 102 receives the frequency information or mapping at step 408, assigns the LCNs or symbols to physical channels (or individual streams of multiplexed physical channels, referred to herein interchangeably as "channels") accordingly at step 410 and uses the assigned LCNs or symbols for compression at step 412, as described above, only writing the number of bits necessary for each LCN or symbol at step 304.

Figure 5:
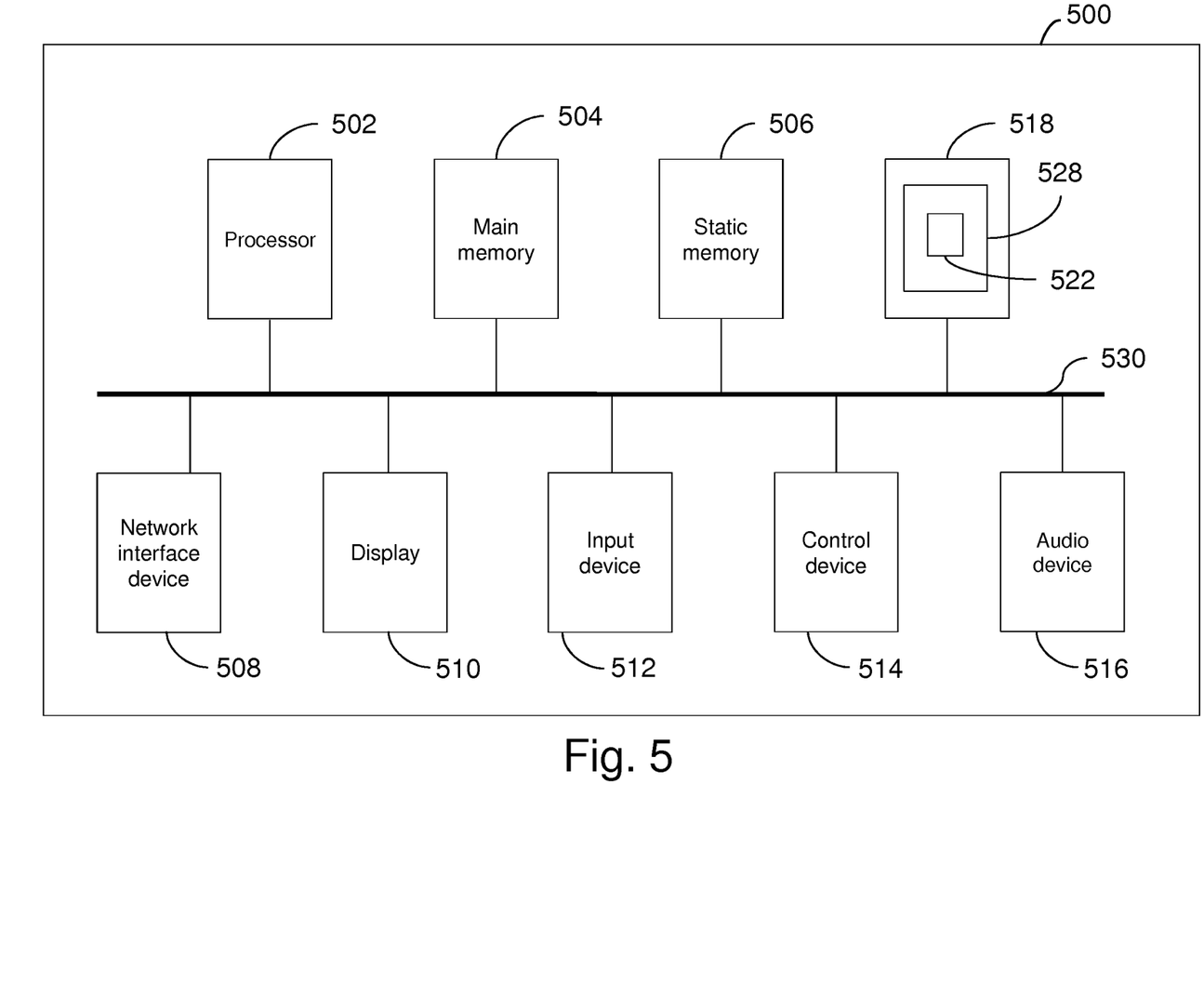
FIG. 5 illustrates a computing device that is used in some embodiments to implement the disclosed processes.

FIG. 5 illustrates a block diagram of one implementation of a computing device 500 as, in dependence on the embodiments, may implement or partially implement the receiver 102, broadcast provider 106 infrastructure and/or data collection service provider 108 infrastructure. A set of instructions, for causing the computing device 500 to perform any one or more of the methodologies discussed herein, may be executed in the computing device 500. The computing device may be connected (e.g., networked) to other machines in a Local Area Network (LAN), an intranet, an extranet, or the Internet. The computing device may operate in the capacity of a server or a client machine in a client-server network environment, or as a peer machine in a peer-to-peer (or distributed) network environment. The computing device may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single computing device is illustrated, the term "computing device" shall also be taken to include any collection of machines (e.g., computers) that individually or jointly execute a set (or multiple sets) of instructions to perform any one or more of the methodologies discussed herein.

The example computing device 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory (e.g., a data storage device 518), which communicate with each other via a bus 530.

Processing device 502 represents one or more general-purpose processors such as a microprocessor, central processing unit, or the like. More particularly, the processing device 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 502 may also be one or more special-purpose processing devices such as an application specific integrated circuit (ASIC), a field programmable gate array (FPGA), a digital signal processor (DSP), network processor, or the like. Processing device 502 is configured to execute the processing logic (instructions 522) for performing the operations and steps discussed herein.

The computing device 500 may further include a network interface device 508. The computing device 500 also may include a video display unit 510 (e.g., a liquid crystal display (LCD) or a cathode ray tube (CRT)), an alphanumeric input device 512 (e.g., a keyboard or touchscreen), a cursor control device 514 (e.g., a mouse or touchscreen), and an audio device 516 (e.g., a speaker).

The data storage device 518 may include one or more machine-readable storage media (or more specifically one or more non-transitory computer-readable storage media) 528 on which is stored one or more sets of instructions 522 embodying any one or more of the methodologies or functions described herein. The instructions 522 may also reside, completely or at least partially, within the main memory 504 and/or within the processing device 502 during execution thereof by the computer system 500, the main memory 504 and the processing device 502 also constituting computer-readable storage media.

In some cases, in particular referring to the receiver 102, the computing device may further comprise custom circuits and/or modules, for example to implement broadcast receiving and decoding functionalities, CAS functionalities, and so forth.

The various methods described above may be implemented by a computer program. The computer program may include computer code arranged to instruct a computer to perform the functions of one or more of the various methods described above. The computer program and/or the code for performing such methods may be provided to an apparatus, such as a computer, on one or more computer readable media or, more generally, a computer program product. The computer readable media may be transitory or non-transitory. The one or more computer readable media could be, for example, an electronic, magnetic, optical, electromagnetic, infrared, or semiconductor system, or a propagation medium for data transmission, for example for downloading the code over the Internet. Alternatively, the one or more computer readable media could take the form of one or more physical computer readable media such as semiconductor or solid state memory, magnetic tape, a removable computer diskette, a random access memory (RAM), a read-only memory (ROM), a rigid magnetic disc, and an optical disk, such as a CD-ROM, CD-R/VV or DVD.

In an implementation, the modules, components and other features described herein can be implemented as discrete hardware components or integrated in the functionality of hardware components such as ASICS, FPGAs, DSPs or similar devices.

A "hardware component" is a tangible (e.g., non-transitory) physical component (e.g., a set of one or more processors) capable of performing certain operations and may be configured or arranged in a certain physical manner. A hardware component may include dedicated circuitry or logic that is permanently configured to perform certain operations. A hardware component may be or include a special-purpose processor, such as a field programmable gate array (FPGA) or an ASIC. A hardware component may also include programmable logic or circuitry that is temporarily configured by software to perform certain operations.

Accordingly, the phrase "hardware component" should be understood to encompass a tangible entity that may be physically constructed, permanently configured (e.g., hardwired), or temporarily configured (e.g., programmed) to operate in a certain manner or to perform certain operations described herein.

In addition, the modules and components can be implemented as firmware or functional circuitry within hardware devices. Further, the modules and components can be implemented in any combination of hardware devices and software components, or only in software (e.g., code stored or otherwise embodied in a machine-readable medium or in a transmission medium).

Unless specifically stated otherwise, as apparent from the following discussion, it is appreciated that throughout the description, discussions utilizing terms such as "receiving", "determining", "comparing", "enabling", "maintaining," "identifying", "storing", "generating", "causing", "decoding", "encoding" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

It is to be understood that the above description is intended to be illustrative, and not restrictive. Many other implementations will be apparent to those of skill in the art upon reading and understanding the above description. Although the present disclosure has been described with reference to specific example implementations, it will be recognized that the disclosure is not limited to the implementations described, but can be practiced with modification and alteration within the spirit and scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

The invention claimed is:

1. A television broadcast receiver comprising:
a memory for storing channel view data encoding channel view events and a processor configured to:
store channel view data in the memory;
generate a signal encoding the channel view data, wherein the signal is an audio and/or video signal; and
cause the signal to be presented to the viewer for capture by the viewer with a signal capture device,
wherein the channel view data is used by the processor to encode channel view events such that smaller symbols are used for more frequently viewed channels.

2. The receiver according to claim 1, wherein generating the signal comprises generating a 2-dimensional pattern encoding the channel view data and presenting the signal comprises causing display of the 2-dimensional pattern on a display device.

3. The receiver according to claim 1, wherein the processor is configured to periodically generate the signal and cause it to be presented.

4. The receiver according to claim 1, wherein the processor is configured to receive information indicative of the frequency with which channels are viewed or indicative of a mapping between channels and symbols representing channels and to use the information to encode channel view events.

5. The receiver according to claim 1, wherein the processor is configured to receive information indicative of the frequency with which channels are viewed and to use the information to encode channel view events, wherein using the information to encode channel view events comprises associating each channel with a respective symbol such that the number of bits needed to encode each symbol are negatively correlated with the viewing frequency of the corresponding channel and using the symbols to encode channel view events.

6. The receiver according to claim 1, wherein encoding channel view events comprises encoding channel view events using a duration indication and a start time indication for each channel view event and wherein respective representations of the duration and/or start time indications are selected dynamically.

7. The receiver as claimed in claim 1, wherein the receiver is a set-top box or television set configured to receive one or more of terrestrial, cable or satellite broadcasts.

8. A method of receiving information about channel view events from a broadcast receiver, the method comprising:
- receiving a signal encoding channel view data, wherein the signal is a still image or video signal and/or an audio signal and the channel view data encodes channel view events;
- decoding the signal to obtain information about channel view events;
- using the information to compute a viewing frequency for a set of channels broadcast to the receiver for use in associating logical channel symbols with broadcast channels in the set of channels.

9. The method according to claim 8, wherein, prior to receiving the signal, the signal has been captured from the receiver by a viewer using a signal capture device.

10. The method according to claim 9, wherein the signal capture device is a mobile phone.

11. The method according to claim 9, wherein the viewer is a subscriber of broadcast services provided by a broadcast provider, the signal is received by the broadcast provider and, optionally transmitted to a data collection service provider, wherein the data collection service provider decodes the signal and provides the channel view data and/or the information about channel view events to the broadcast provider.

12. The method according to claim 11, wherein the signal is received by the broadcast provider when the subscriber renews his subscription.

13. The method according to claim 8, the method comprising broadcasting, to the receiver, information indicative of the viewing frequency for the set of channels or information associating logical channel symbols with broadcast channels in the set of channels in accordance with the viewing frequency.

14. The method according to claim 13, the method comprising broadcasting the information to the receiver as part of management information in a conditional access system.

15. A television broadcast receiver comprising:
- a memory for storing channel view data encoding channel view events and a processor configured to:
- store channel view data in the memory;
- generate a signal encoding the channel view data, wherein the signal is an audio and/or video signal; and
- cause the signal to be presented to the viewer for capture by the viewer with a signal capture device,
- wherein the processor is configured to receive information indicative of the frequency with which channels are viewed and to use the information to encode channel view events, wherein using the information to encode channel view events comprises associating each channel with a respective symbol such that the number of bits needed to encode each symbol are negatively correlated with the viewing frequency of the corresponding channel and using the symbols to encode channel view events.

* * * * *